US012166067B2

(12) United States Patent
Shih et al.

(10) Patent No.: US 12,166,067 B2
(45) Date of Patent: Dec. 10, 2024

(54) TITANIUM LAYER AS GETTER LAYER FOR HYDROGEN IN A MIM DEVICE

(71) Applicant: Taiwan Semiconductor Manufacturing Company, Ltd., Hsin-Chu (TW)

(72) Inventors: Chi-Yuan Shih, Hsinchu (TW); Kai-Fung Chang, Taipei (TW); Shih-Fen Huang, Jhubei (TW); Yan-Jie Liao, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/729,321

(22) Filed: Apr. 26, 2022

(65) Prior Publication Data

US 2022/0254871 A1   Aug. 11, 2022

Related U.S. Application Data

(62) Division of application No. 16/531,252, filed on Aug. 5, 2019, now Pat. No. 11,322,580.

(51) Int. Cl.
*H01L 29/00* (2006.01)
*H01L 49/02* (2006.01)

(52) U.S. Cl.
CPC ................... *H01L 28/75* (2013.01)

(58) Field of Classification Search
None
See application file for complete search history.

(56) References Cited

U.S. PATENT DOCUMENTS

| 6,066,868 | A | | 5/2000 | Evans, Jr. | |
|---|---|---|---|---|---|
| 6,130,103 | A | * | 10/2000 | Cuchiaro | H01L 29/40111 257/E21.208 |
| 6,225,156 | B1 | | 5/2001 | Cuchiaro et al. | |
| 6,512,256 | B1 | * | 1/2003 | Cuchiaro | H01L 28/55 257/295 |
| 8,791,006 | B2 | * | 7/2014 | Lin | H01L 23/49816 438/381 |

(Continued)

OTHER PUBLICATIONS

VAC Aero International. "Getter Materials." Published on Jun. 5, 2017. Retrieved online on May 6, 2019 from https://vacaero.com/information-resources/vac-aero-training/1166-getter-materials.html.

(Continued)

*Primary Examiner* — Hung K Vu
(74) *Attorney, Agent, or Firm* — Eschweiler & Potashnik, LLC

(57) ABSTRACT

In some embodiments, the present disclosure relates to a method of forming a metal-insulator-metal (MIM) device. The method may be performed by depositing a bottom electrode layer over a substrate, depositing a dielectric layer over the bottom electrode layer, depositing a top electrode layer over the dielectric layer, and depositing a first titanium getter layer over the top electrode layer. The first titanium getter layer, the top electrode layer, and the dielectric layer are patterned to expose a peripheral portion of the bottom electrode layer. A passivation layer is deposited over the substrate, the first titanium getter layer, and the peripheral portion of the bottom electrode layer.

20 Claims, 11 Drawing Sheets

(56) References Cited

U.S. PATENT DOCUMENTS

| | | | |
|---|---|---|---|
| 2001/0010377 A1* | 8/2001 | Cuchiaro | H10B 53/00 257/295 |
| 2003/0136989 A1 | 7/2003 | Amiotti et al. | |
| 2008/0121963 A1 | 5/2008 | Govindarajan | |
| 2016/0181353 A1 | 6/2016 | Ando et al. | |
| 2016/0358741 A1 | 12/2016 | Schultz et al. | |
| 2017/0294363 A1 | 10/2017 | Chang et al. | |
| 2020/0020845 A1 | 1/2020 | Chen et al. | |

OTHER PUBLICATIONS

Dodd, Simon. "MEMS Piezo Actuators." ST developers Conference, Oct. 4, 2016.
U.S. Appl. No. 16/108,384, filed Aug. 22, 2018.
Oregon State University. "Advance could change modern electronics: High-performance 'metal-insulator-metal' diode created." Phys.org, published on Oct. 29, 2010.
Wikipedia.org "Atomic Ratio." Published on Jul. 13, 2018.
Wikipedia.org "Diode" Published on Apr. 14, 2019.
Wikipedia.org "Electric Arc." Published on Mar. 30, 2019.
Wikipedia.org "Elemental Analysis." Published on Feb. 26, 2019.
Wikipedia.org "Getter." Published on Apr. 17, 2019.
VAC AERO International. "Getter Materials." Published on Jun. 5, 2017.
Sciencedirect Topics "Getters—An Overview." The date of publication is unknown. Retrieved online on May 6, 2019 from https://www.sciencedirect.com/topics/engineering/getters.
Autodesk. "Feel the Squeeze: How Piezoelectricity Works to Make Crystals Conduct Electric Current." Published in 2016.
Bersuker et al. "Metal oxide resistive random access memory (RRAM) technology." Advances in Non-Volatile Memory and Storage Technology, published in 2014.
Wikipedia.org. "Metal-insulator-metal." Published on Dec. 25, 2018.
Wikipedia.org "Time-dependent gate oxide breakdown." Published on Nov. 27, 2018.
Non-Final Office Action dated Jan. 26, 2021 for U.S. Appl. No. 16/531,252.
Non-Final Office Action dated Jul. 22, 2021 for U.S. Appl. No. 16/531,252.
Notice of Allowance dated Dec. 16, 2021 for U.S. Appl. No. 16/531,252.

* cited by examiner

TITANIUM LAYER AS GETTER LAYER FOR HYDROGEN IN A MIM DEVICE

REFERENCE TO RELATED APPLICATION

This application is a Divisional of U.S. application Ser. No. 16/531,252, filed on Aug. 5, 2019, the contents of which are hereby incorporated by reference in their entirety.

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer. During fabrication, byproducts (e.g., ions, gases, etc.) may be left behind in critical layers of the semiconductor device, causing damage and thus, a reduction in lifetime of the semiconductor device. To prevent damage by these byproducts, some semiconductor devices include a getter layer configured to absorb the byproducts. Thus, the byproducts may accumulate in the getter layer, instead of in critical layers and damage to the semiconductor device due to the byproducts may be prevented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
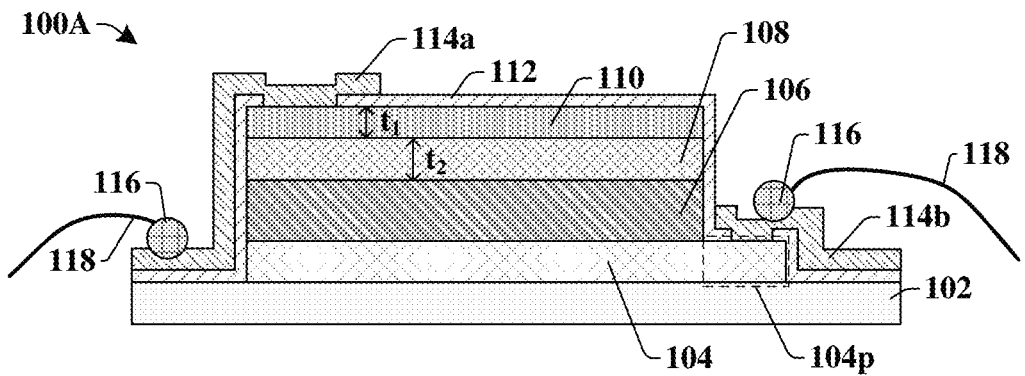
FIGS. 1A, 1B, 1C, and 1D illustrate cross-sectional views of some embodiments of a metal-insulator-metal (MIM) device comprising a titanium getter layer arranged above a top electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-insulator-metal (MIM) device includes a dielectric layer arranged between top and bottom electrodes. When a sufficient voltage bias is applied across the top and bottom electrodes, properties of the dielectric layer change due to a mechanism of the dielectric layer. The mechanism depends on the material of the dielectric layer. In some embodiments, the dielectric layer may comprise, for example, a ceramic, a metal oxide, a nitride, a carbide, silicon oxide, or a piezoelectric. In some embodiments, the sufficient voltage bias causes a change in the mechanical properties of the dielectric layer. For example, in some embodiments, the dielectric layer may comprise a piezoelectric material, and the sufficient voltage bias applied to top and bottom electrodes may induce a mechanical strain in the piezoelectric layer. The mechanical strain may, for example, be used in acoustical, mechanical, and/or optical applications. In other embodiments, the dielectric layer may comprise a ceramic material, and the sufficient voltage bias across the ceramic material may induce atoms to shift into a crystal structure formation that changes a resistance of the ceramic material. The resistive state of the dielectric layer may, for example, be used to store data in a memory cell.

A MIM device may be formed by depositing a bottom electrode over a substrate, depositing a dielectric layer over the bottom electrode, and depositing a top electrode over the bottom electrode. The top electrode and the dielectric layer are then patterned using photolithography and etching, such that a portion of bottom electrode is exposed. Metal contacts are then formed on the top electrode and on the exposed portion of the bottom electrode such that a voltage bias may be applied across the top and bottom electrodes.

However, it has been appreciated that hydrogen ions, which are challenging to remove, may be left behind within the bottom electrode, the dielectric layer, and/or the top electrode as a residual effect of the formation of the MIM device. For example, in some embodiments, a photoresist may be used for patterning the top electrode and the dielectric layer, and the stripping of the photoresist may leave behind hydrogen ions. In other embodiments, the wet and/or dry etches used in the formation of the MIM device may also leave behind hydrogen ions. During the application of the MIM device, if a negative voltage is applied to the top electrode, the hydrogen ions may accumulate at a first interface between the top electrode and the dielectric layer. In contrast, if a positive voltage is applied to the top electrode, the hydrogen ions may accumulate at a second interface between the bottom electrode and the dielectric layer. The hydrogen ions may produce hydrogen gas at the interface, thereby causing interface delamination, arcing, and eventually, dielectric breakdown.

Various embodiments of the present disclosure provide a MIM device which includes a titanium getter layer configured to function as a getter layer for hydrogen. In some embodiments, the titanium getter layer is disposed below the bottom electrode. In other embodiments, the titanium getter layer is disposed above the top electrode. The titanium getter layer has a higher affinity for hydrogen than the dielectric layer, thereby allowing the titanium getter layer to absorb hydrogen (e.g., to form compounds with hydrogen, to adsorb) easier than the dielectric layer. Thus, the hydrogen ions may accumulate in the titanium getter layer, away from the dielectric layer, and dielectric breakdown may be mitigated to increase a lifetime of the MIM device. Thus, the present disclosure provides a method for producing a MIM device with a titanium getter layer to produce reliable MIM devices.

FIG. 1A illustrates a cross-sectional view 100A of some embodiments of a metal-insulator-metal (MIM) device comprising a titanium getter layer above a top electrode.

The MIM device in the cross-sectional view 100A includes a bottom electrode 104 disposed over a substrate 102. A dielectric layer 106 is disposed over the bottom electrode 104, and a top electrode 108 is disposed over the dielectric layer 106. In some embodiments, the dielectric layer 106 may comprise a ceramic, a metal oxide, aluminum nitride, a piezoelectric material (e.g., lead zirconate titanate, barium titanate, lithium niobate, or the like), silicon oxide, a carbide, or a nitride. In some embodiments, a titanium getter layer 110 is disposed over the top electrode 108. The titanium getter layer 110 may directly contact the top electrode 108. In some embodiments, the titanium getter layer 110 is separated from the dielectric layer 106 by the top electrode 108.

The dielectric layer 106 has a first affinity for hydrogen, and the titanium getter layer 110 has a second affinity for hydrogen that is greater than the first affinity. The greater second affinity for hydrogen allows for the titanium getter layer 110 to collect (e.g., absorb, adsorb, form compounds with) hydrogen easier than the dielectric layer 106. Thus, more hydrogen may accumulate in the titanium getter layer 110 than in the dielectric layer 106. For example, in some embodiments, an affinity for hydrogen may be quantified by measuring a getter capacity for hydrogen. It will be appreciated that throughout this disclosure, when getter capacities or affinities are being compared, they are being compared under the same environmental conditions (e.g., pressure, temperature, etc.). Thus, the titanium getter layer 110 may have a higher getter capacity for hydrogen than the dielectric layer 106. In other words, the titanium getter layer 110 may be defined as a getter layer for hydrogen, wherein the getter layer comprises titanium. Further, in some embodiments, the top electrode 108 has a third affinity for hydrogen, and the bottom electrode 104 has a fourth affinity for hydrogen, wherein the second affinity is greater than the third and fourth affinities. In such embodiments, the greater second affinity for hydrogen allows for the titanium getter layer 110 to absorb hydrogen easier than the top electrode 108, the dielectric layer 106 and/or the bottom electrode 104.

In some embodiments, the titanium getter layer 110 comprises a different material than the top and bottom electrodes 108, 104. In some embodiments, the titanium getter layer 110 comprises pure titanium to maximize the second affinity for hydrogen. In such embodiments, the titanium getter layer 110 may have a getter capacity for hydrogen up to approximately 27 pascal liters per milligram. In other embodiments, the titanium getter layer 110 comprises titanium and oxygen. In such other embodiments, an atomic ratio of oxygen to titanium in the titanium getter layer 110 is less than 50 percent. Having an atomic ratio of oxygen to titanium in the titanium getter layer 110 that is less than 50 percent causes the second affinity for hydrogen to be stronger than the first affinity.

In some embodiments, the titanium getter layer 110 has a first thickness $t_1$ and the top electrode 108 has a second thickness $t_2$. In some embodiments, a first ratio of the first thickness $t_1$ to the second thickness $t_2$ is greater than 20 percent (i.e., $t_1/t_2 > 0.2$). In other embodiments where the first ratio is less than 20 percent, the second affinity for hydrogen may not be as effective. Thus, to increase the accumulation of hydrogen in the titanium getter layer 110, the first ratio is greater than 20 percent. Further, in yet other embodiments, the bottom and/or top electrodes 104, 108 may also comprise titanium. In such other embodiments, the third and/or fourth affinities may be substantially equal to the second affinity. Thus, in such other embodiments, the bottom and/or top electrodes 104 may act as additional getter layers for hydrogen to prevent hydrogen accumulation in the dielectric layer 106.

In some embodiments, a passivation layer 112 is disposed over and contacts top surfaces of the titanium getter layer 110 and the substrate 102, in addition to sidewalls of the titanium getter layer 110, the top electrode 108, the dielectric layer 106, and the bottom electrode 104. In some embodiments, the titanium getter layer 110 has a first width, the bottom electrode 104 has a second width, the dielectric layer 106 has a third width, and the top electrode 108 has a fourth width. In some embodiments, the second width of the bottom electrode 104 is greater than the first, third, and fourth widths, such that a peripheral portion 104p of the bottom electrode 104 does not directly underlie the dielectric layer 106, the top electrode 108, or the titanium getter layer 110. In such embodiments, the passivation layer 112 may be disposed over and contact a top surface of the bottom electrode 104. In some embodiments, the titanium getter layer 110, the top electrode 108, and the dielectric layer 106 may be substantially aligned with one another.

In some embodiments, a first metal contact 114a may extend through the passivation layer 112 to contact the titanium getter layer 110, such that the first metal contact 114a is electrically coupled to the top electrode 108. A second metal contact 114b may extend through the passivation layer 112 to contact the peripheral portion 104p of the bottom electrode 104. In some embodiments, solder bumps 116 may couple wires 118 to the first and second metal contacts 114a, 114b. In some embodiments, the wires 118 are coupled to a voltage source to apply a voltage bias across the bottom electrode 104 and the top electrode 108. In some embodiments, residual hydrogen ions in the MIM device accumulate in the titanium getter layer 110 and away from the dielectric layer 106, such that hydrogen ions do not damage the dielectric layer 106.

Figure 1B:
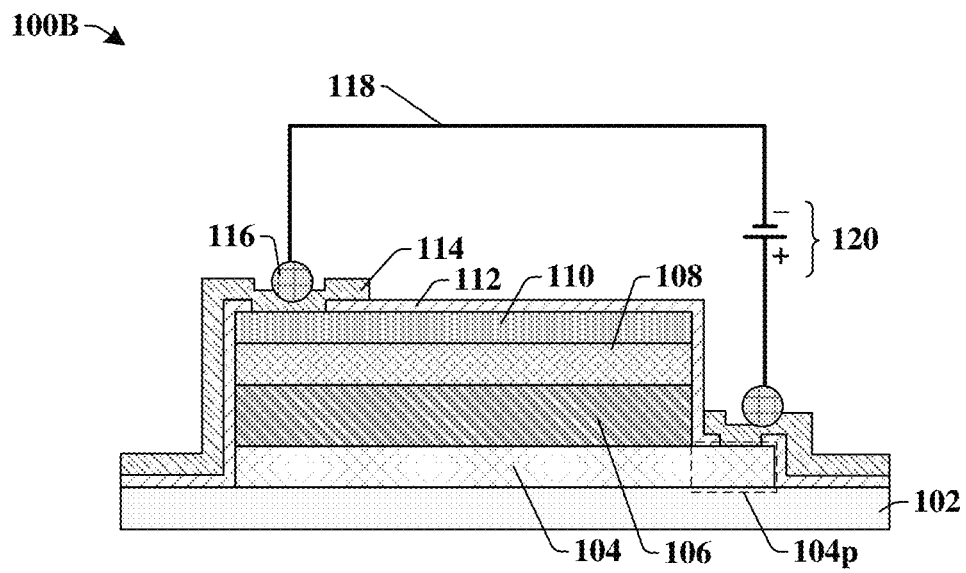

FIG. 1B illustrates a cross-sectional view 100B of some additional embodiments of a MIM device comprising a titanium getter layer above a top electrode.

The MIM device in the cross-sectional view 100B of FIG. 1B comprises the same features as the MIM device in the cross-sectional view 100A of FIG. 1A with the addition of voltage terminals 120. In some embodiments, the wires 118 are coupled to voltage terminals 120, such that the top electrode 108 is coupled to a negative voltage terminal and the bottom electrode 104 is coupled to a positive voltage terminal. In such embodiments, hydrogen ions, which have a positive charge, may move in the direction of the voltage terminal 120 that is negative. Thus, the titanium getter layer 110 is coupled to the voltage terminal 120 that is negative such that the hydrogen ions are even more likely accumulate in the titanium getter layer 110 and away from the dielectric layer 106.

Figure 1C:
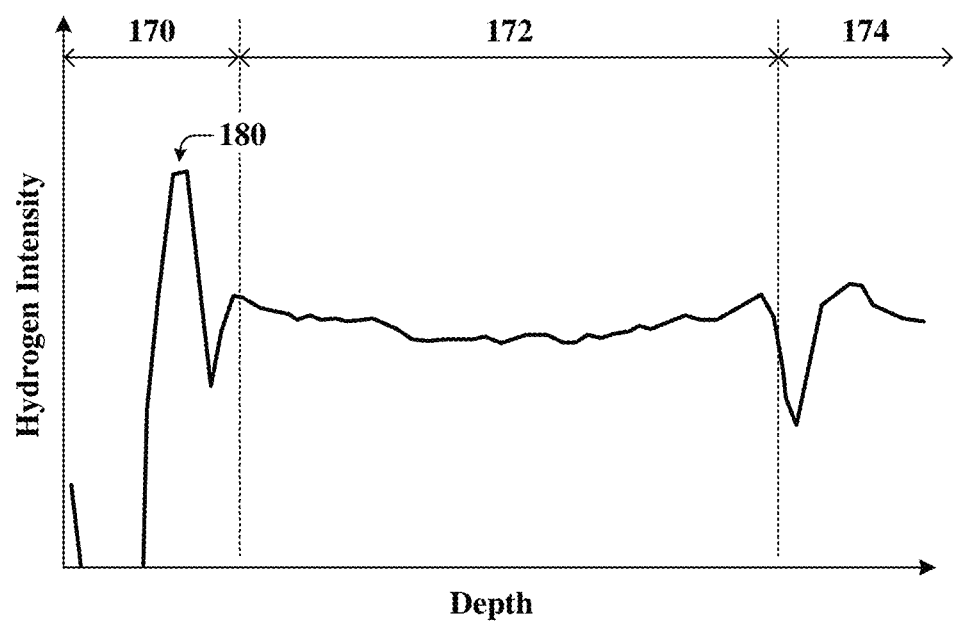

For example, FIG. 1C illustrates a graph 100C showing an exemplary hydrogen content as a function of position of the MIM device between two terminals after the bias conditions illustrated in FIG. 1B have been applied (e.g., the bottom electrode 104 coupled to a positive voltage terminal and the top electrode 108 coupled to a negative terminal). The depth may be divided into a top portion 170 comprising the top electrode 108 and the titanium getter layer 110, a bottom portion 174 comprising the bottom electrode 104, and a middle portion 172 comprising the dielectric layer 106. The hydrogen intensity may be measured by an elemental analysis procedure (e.g., spectroscopy). A highest point 180 of the hydrogen intensity in the top portion 170 indicates that the hydrogen has accumulated in the titanium getter layer 110, which is away from the interface between the middle portion 172 and the top portion 170. Thus, after the bias conditions illustrated in FIG. 1B have been applied, an elemental analysis procedure may indicate the presence of the titanium getter layer 110 above the top electrode 108.

Figure 1D:
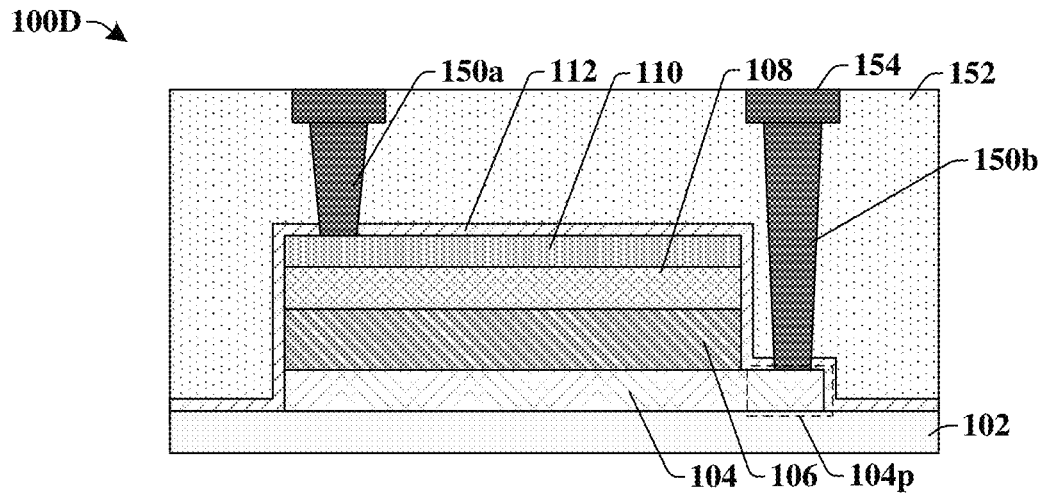

FIG. 1D illustrates a cross-sectional view 100D of some additional embodiments of a MIM device comprising a titanium getter layer above a top electrode.

The MIM device in the cross-sectional view 100D of FIG. 1D comprises the same substrate 102, the bottom electrode 104, the dielectric layer 106, the top electrode 108, the titanium getter layer 110, and the passivation layer 112 as the MIM device in the cross-sectional view 100A of FIG. 1A. Additionally, the MIM device in the cross-sectional view 100D comprises a first contact via 150a that extends through the passivation layer 112 to contact the titanium getter layer 110. A second contact via 150b extends through the passivation layer 112 to contact the bottom electrode 104. The first and second contact vias 150a, 150b are coupled to metal lines 154 and embedded in an inter-layer dielectric (ILD) structure 152. In other embodiments (not shown), the ILD structure 152 is also beneath the bottom electrode 104. In such other embodiments, an etch stop layer may be disposed directly beneath and directly contact the bottom electrode 104 instead of the substrate 102. Further, in some embodiments, the ILD structure 152 and the passivation layer 112 comprise a same material.

Figure 2A:
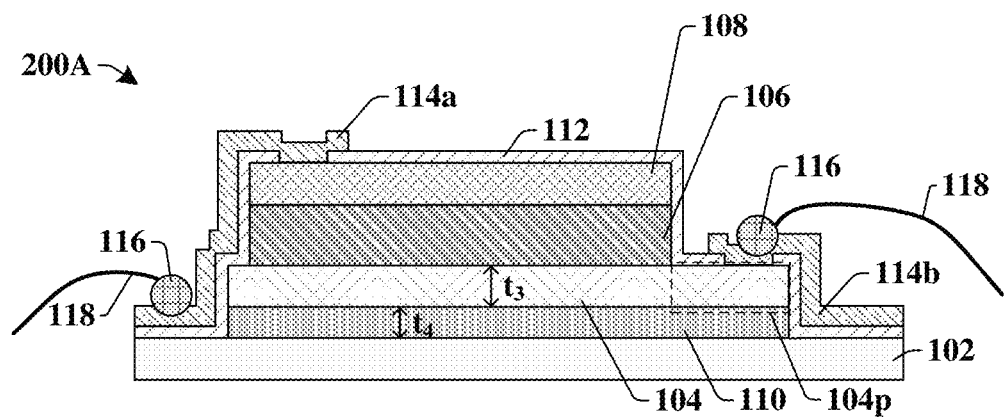
FIGS. 2A, 2B, and 2C illustrate cross-sectional views of some embodiments of a MIM device comprising a titanium getter layer arranged below a bottom electrode.

FIG. 2A illustrates a cross-sectional view 200A of some embodiments of a MIM device comprising a titanium getter layer below a bottom electrode.

The MIM device of FIG. 2A includes a titanium getter layer 110 disposed over a substrate 102. A bottom electrode 104 is disposed over the titanium getter layer 110. A top electrode 108 over a dielectric layer 106 is disposed over the bottom electrode 104. In some embodiments, a passivation layer 112 is disposed over and contacts top surfaces of the top electrode 108 and the substrate 102, in addition to sidewalls of the top electrode 108, the dielectric layer 106, the bottom electrode 104 and the titanium getter layer 110. Thus, in some embodiments, a peripheral portion 104p of the bottom electrode laterally extends past the dielectric layer 106, such that the peripheral portion 104p does not directly underlie the dielectric layer 106 or the top electrode 108. In some embodiments, the titanium getter layer 110 is substantially aligned beneath the bottom electrode 104, such that the titanium getter layer 110 directly underlies the peripheral portion 104p of the bottom electrode 104. In some embodiments, the top electrode 108 is substantially aligned over the dielectric layer 106. In some embodiments, outer sidewalls of the dielectric layer 106 and outer sidewalls of the bottom electrode 104 are not aligned.

In some embodiments, a first metal contact 114a extends through the passivation layer 112 and is electrically coupled to the top electrode 108. Similarly, in some embodiments, a second metal contact 114b extends through the passivation layer 112, contacts the peripheral portion 104p of the bottom electrode 104, and thus, is electrically coupled to the bottom electrode 104. In some embodiments, bottom and top electrodes 104, 108 are coupled to other devices within a circuit via solders bumps 116 and wires 118.

The dielectric layer 106 has a first affinity for hydrogen, and the titanium getter layer 110 has a second affinity for hydrogen that is greater than the first affinity. The greater second affinity for hydrogen allows for the titanium getter layer 110 to absorb hydrogen easier than the dielectric layer 106. Thus, hydrogen may accumulate in the titanium getter layer 110, which is separated from the dielectric layer 106, and damage to the dielectric layer 106 caused by hydrogen accumulation may be mitigated. In some embodiments, the top electrode 108 has a third affinity for hydrogen and the bottom electrode 104 has a fourth affinity for hydrogen, wherein the second affinity is greater than the third and fourth affinities. Thus, the second affinity for hydrogen is the strongest, so that hydrogen ions accumulate in the titanium getter layer 110 that is separated from the dielectric layer 106. In some embodiments, the titanium getter layer 110 has a fourth thickness $t_4$ and the bottom electrode layer 104 has a third thickness $t_3$. In some embodiments, a second ratio of the fourth thickness $t_4$ to the third thickness $t_3$ is greater than 20 percent to increase the effectiveness of the titanium getter layer 110 as a getter layer for hydrogen.

In some embodiments, the titanium getter layer 110 of FIG. 2A consists of titanium. In other embodiments, the titanium getter layer 110 comprises titanium and oxygen. In some embodiments, an atomic ratio of oxygen to titanium in the titanium getter layer 110 is less than 50 percent. In other embodiments, a molar ratio, a ratio by mass, and/or a ratio by volume of oxygen to titanium in the titanium getter layer 110 is less than 50 percent. Further, in yet other embodiments, the bottom and/or top electrodes 104, 108 may also comprise titanium. In some such embodiments, the third and/or fourth affinities may be substantially equal to the second affinity. Thus, in such other embodiments, the bottom and/or top electrodes 104, 108 may act as additional getter layers for hydrogen to prevent hydrogen accumulation in the dielectric layer 106.

Figure 2B:
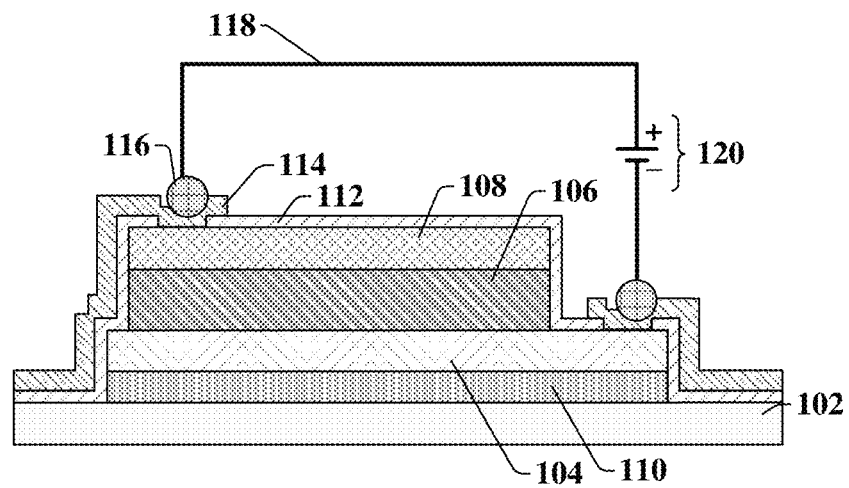

FIG. 2B illustrates a cross-sectional view 200B of some additional embodiments of a MIM device comprising a titanium getter layer below a bottom electrode.

The MIM device in the cross-sectional view 200B of FIG. 2B comprises the same features as the MIM device in the cross-sectional view 200A of FIG. 2A with the addition of voltage terminals 120. In some embodiments, the wires 118 are coupled to voltage terminals 120, such that the top electrode 108 is coupled to a positive voltage terminal and the bottom electrode 104 is coupled to a negative voltage terminal. In such embodiments, hydrogen ions, which have a positive charge, may move in the direction of the voltage terminal 120 that is negative. Thus, the titanium getter layer 110 is below the bottom electrode 104 because the bottom electrode 104 is coupled to the voltage terminal 120 that is negative. Thus, the hydrogen ions are even more likely accumulate in the titanium getter layer 110, which is away from the dielectric layer 106.

Figure 2C:
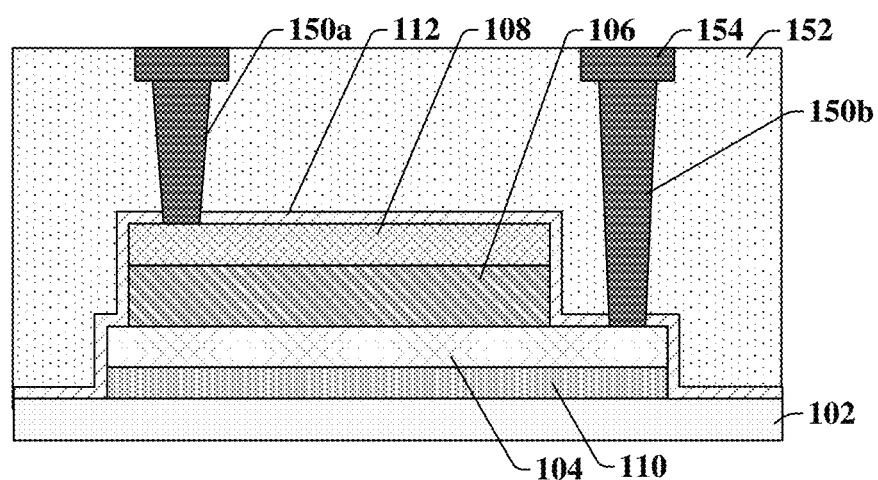

FIG. 2C illustrates a cross-sectional view 200C of some additional embodiments of a MIM device comprising a titanium getter layer below a bottom electrode.

The MIM device in the cross-sectional view 200C of FIG. 2C comprises the same substrate 102, the bottom electrode 104, the dielectric layer 106, the top electrode 108, the titanium getter layer 110, and the passivation layer 112 as the MIM device in the cross-sectional view 200A of FIG. 2A. Additionally, the MIM device in the cross-sectional view 200C comprises a first contact via 150a that extends through the passivation layer 112 to contact the top electrode 108. A second contact via 150b extends through the passivation layer 112 to contact the bottom electrode 104. The first and second contact vias 150a, 150b are coupled to metal lines 154 and embedded in an inter-layer dielectric (ILD) structure 152. In other embodiments (not shown), the ILD structure 152 is also beneath the titanium getter layer 110. In such other embodiments, an etch stop layer may be disposed directly beneath and directly contact the titanium getter layer 110 instead of the substrate 102.

Figure 3A:
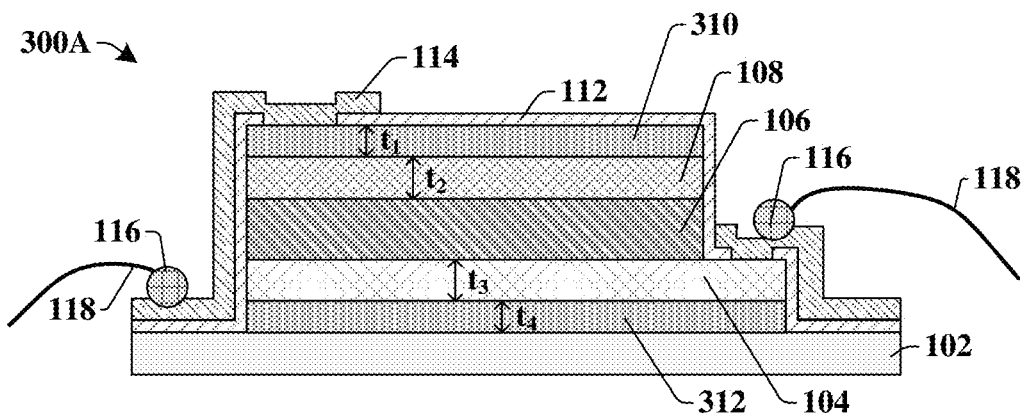
FIGS. 3A and 3B illustrate cross-sectional views of some embodiments of a MIM device comprising a first titanium getter layer arranged above the top electrode and a second titanium getter layer arranged below the bottom electrode.

FIG. 3A illustrates a cross-sectional view 300A of some embodiments of a MIM device comprising a first titanium getter layer above a top electrode and a second titanium getter layer below a bottom electrode.

In some embodiments, a first titanium getter layer 310 is disposed over the top electrode 108, and a second titanium getter layer 312 is arranged below the bottom electrode 104. In such embodiments, the first titanium getter layer 310 may be spaced apart from the dielectric layer 106 by the top electrode 108, and the second titanium getter layer 312 may be spaced apart from the dielectric layer 106 by the bottom electrode 104. The dielectric layer 106 has a first affinity for hydrogen, the first and second titanium getter layers 310, 312 have a second affinity for hydrogen, the top electrode 108 has a third affinity for oxygen, and the bottom electrode 104 has a fourth affinity for hydrogen. In some embodiments, the second affinity is greater than the first, third and fourth affinities, such that hydrogen ions accumulate in the first and second titanium getter layers 310, 312 instead of the dielectric layer 106.

In some embodiments, the first titanium getter layer 310 and the second titanium getter layer 312 each consist of titanium to maximize the second affinity for hydrogen. In other embodiments, the first titanium getter layer 310 and/or the second titanium getter layer 312 may comprise titanium and oxygen. In such other embodiments, an atomic ratio of oxygen to titanium in the first titanium getter layer 310 is less than 50 percent such that the second affinity for hydrogen is still stronger than the first affinity. Further, in such other embodiments, an atomic ratio of oxygen to titanium in the second titanium getter layer 312 is less than 50 percent such that the third affinity for hydrogen is still stronger than the first affinity.

Thus, in some embodiments, the first and second titanium getter layers 310, 312 comprise a different material than the top and bottom electrodes 108, 104, such that hydrogen ions accumulate away from and are spaced apart from the dielectric layer 106. However, in other embodiments, the bottom electrode 104 and/or the top electrode 108 also comprise titanium to aid in the accumulation of hydrogen ions. In such other embodiments, the second affinity for hydrogen may be substantially equal to the affinities of the bottom electrode 104 and/or the top electrode 108. Nevertheless, in such other embodiments, hydrogen ions are still drawn to the top electrode 108, the bottom electrode, and/or the titanium getter layer 110, which is away from the dielectric layer 106.

In some embodiments, the first titanium getter layer 310 has a first thickness $t_1$, the top electrode 108 has a second thickness $t_2$, the bottom electrode 104 has a third thickness $t_3$, and the second titanium getter layer 312 has a fourth thickness $t_4$. In some embodiments, a first ratio of the first thickness $t_1$ to the second thickness $t_2$ is greater than 20 percent. In some embodiments, a second ratio of the fourth thickness $t_4$ to the third thickness $t_3$ is also greater than 20 percent.

In some embodiments, a MIM device includes both the first titanium getter layer 310 above the top electrode 108 and the second titanium getter layer 312 below the bottom electrode 104 because a voltage bias applied across the top electrode 108 and the bottom electrode 104 may vary in polarity. For example, in some embodiments, at a first time, the top electrode 108 may be coupled to a more positive voltage than the bottom electrode 104, and hydrogen ions, which have a positive charge, may move away from the top electrode 108 and towards the bottom electrode 104. In such embodiments at the first time, the second titanium getter layer 312 accumulates the hydrogen ions such that the hydrogen ions do not damage an interface of the bottom electrode 104 and the dielectric layer 106. Then, at a second time, the bottom electrode 104 may be coupled to a more positive voltage than the top electrode 108, and hydrogen ions, which have a positive charge, may move away from the bottom electrode 104 and towards the top electrode 108. In such embodiments at the second time, the first titanium getter layer 310 accumulates the hydrogen ions such that the hydrogen ions do not damage an interface of the top electrode 108 and the dielectric layer 106. Thus, in some embodiments, a MIM device includes the first titanium getter layer 310 above the top electrode 108 and the second titanium getter layer 312 below the bottom electrode 104 to prevent hydrogen ions from accumulating at the dielectric layer 106, independent of the polarity of the applied voltage bias.

Figure 3B:
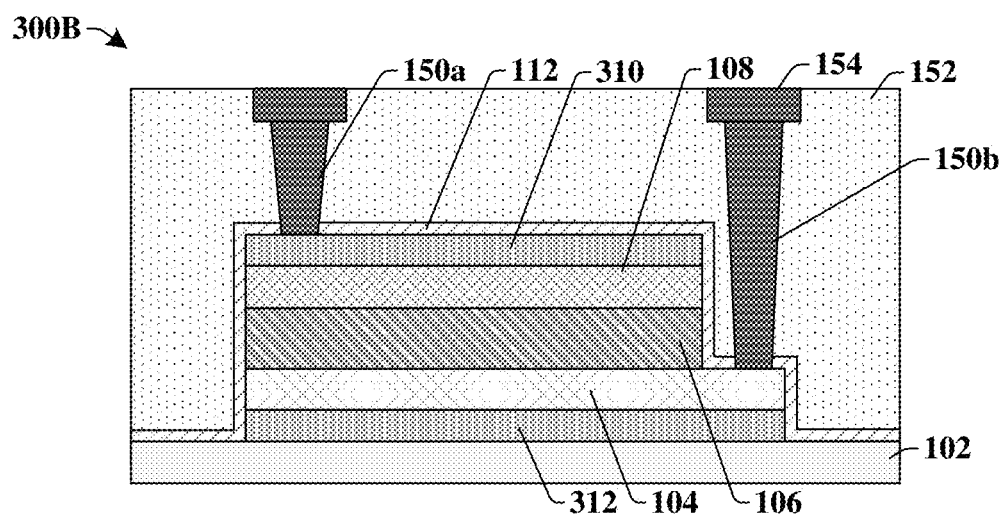

FIG. 3B illustrates a cross-sectional view 300B of some additional embodiments of a MIM device comprising a first titanium getter layer above a top electrode and a second titanium getter layer below a bottom electrode.

The MIM device in the cross-sectional view 300B of FIG. 3B comprises the same features as the MIM device in the cross-sectional view 100D of FIG. 1D with the addition of a second titanium getter layer 312 below the bottom electrode 104.

FIGS. 4-9 illustrate cross-sectional views 400-900 of some embodiments of a method of forming the MIM device of FIG. 1A having a titanium getter layer above a top electrode. Although FIGS. 4-9 are described in relation to a method, it will be appreciated that the structures disclosed in FIGS. 4-9 are not limited to such a method, but instead may stand alone as structures independent of the method.

Figure 4:
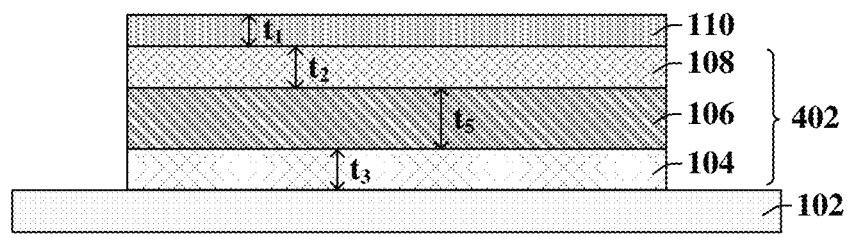
FIGS. 4-9 illustrate cross-sectional views of some embodiments of forming an MIM device comprising a titanium getter layer arranged above a top electrode.

As shown in the cross-sectional view 400 of FIG. 4, a substrate 102 is provided. In some embodiments, the substrate 102 may comprise, for example, silicon, glass, an oxide (e.g., silicon dioxide, aluminum oxide), or the like. A MIM stack 402 may then be formed over the substrate 102. The formation of the MIM stack 402 includes a bottom electrode 104 deposited over the substrate 102, a dielectric layer 106 is deposited over the bottom electrode 104, and a top electrode 108 deposited over the dielectric layer 106. In some embodiments, the bottom electrode 104, the dielectric layer 106, and/or the top electrode 108 may be each deposited by a deposition process (e.g., chemical vapor deposition (CVD), physical vapor deposition (PVD), atomic layer deposition (ALD), etc.). The bottom electrode 104 and the top electrode 108 may each comprise, for example, stainless steel, brass, copper, galvanized iron, mild steel, lead, monel, nickel, nickel-chromium, zinc, phosphor bronze, aluminum, platinum, gold, ruthenium, copper alloy, graphite, calcium, cesium carbonate, lithium fluoride, molybdenum (IV) oxide, silver, carbon, palladium, tin, steel, scandium, titanium, vanadium, chromium, manganese, cobalt, zinc, gallium, indium, thallium, doped silicon, polysilicon, germanium, antimony, tungsten, hafnium, iridium, mixed metal oxide, titanium nitride, tantalum nitride, or the like. In some embodiments, the bottom electrode 104 comprises the same materials as the top electrode 108, whereas in other embodiments, the bottom electrode 104 may comprise a different material than the top electrode 108. In some embodiments, the dielectric layer 106 may comprise a ceramic, a metal oxide, aluminum nitride, a piezoelectric, silicon oxide, a carbide, or a nitride.

Further, in some embodiments, a titanium getter layer 110 is deposited over the top electrode 108. In some embodiments, the titanium getter layer 110 is deposited by a deposition process (e.g., chemical vapor deposition (CVD), physical vapor deposition (PVD), atomic layer deposition (ALD), sputtering, etc.). The titanium getter layer 110 has a second affinity for hydrogen that is greater than that of the dielectric layer 106, the bottom electrode 104, and the top electrode 108. Further, in some embodiments, the titanium getter layer 110 consists of titanium. In other embodiments, the titanium getter layer 110 comprises titanium and oxygen, wherein an atomic ratio of oxygen to titanium in the titanium getter layer 110 is less than 50 percent such that the second affinity is not compromised. In some embodiments, the bottom electrode 104 and/or the top electrode 108 also comprise titanium to aid in the accumulation of hydrogen ions. In such embodiments, the second affinity for hydrogen may be substantially equal to the affinities of the bottom electrode 104 and/or the top electrode 108. Nevertheless, in such embodiments, hydrogen ions are still drawn to the top electrode 108, the bottom electrode, and/or the titanium getter layer 110, which is away from the dielectric layer 106.

Further, in some embodiments, a first ratio of a first thickness $t_1$ of the titanium getter layer 110 to a second thickness $t_2$ of the top electrode 108 is greater than 20 percent such that the second affinity is not compromised. The bottom electrode 104 has a third thickness $t_3$ and the dielectric layer 106 has a fifth thickness $t_5$. In some embodiments, the second thickness $t_2$, the third thickness $t_3$, the fourth thickness $t_4$, and the fifth thickness $t_5$ may each be in a range of between approximately 10 angstroms and approximately 100 angstroms. In other embodiments, the second thickness $t_2$, the third thickness $t_3$, the fourth thickness $t_4$, and the fifth thickness $t_5$ may each be in a range of between approximately 100 angstroms and approximately 0.1 micrometers. In other embodiments, the second thickness $t_2$, the third thickness $t_3$, the fourth thickness $t_4$, and the fifth thickness $t_5$ may each be in a range of between approximately 0.1 micrometers and approximately 1 micrometer. In other embodiments, the second thickness $t_2$, the third thickness $t_3$, the fourth thickness $t_4$, and the fifth thickness $t_5$ may each be in a range of between approximately 1 micrometer and approximately 100 micrometers. In other embodiments, the second thickness $t_2$, the third thickness $t_3$, the fourth thickness $t_4$, and the fifth thickness $t_5$ may each be in a range of between approximately 100 micrometers and approximately 1 millimeter. Nevertheless, the first ratio is greater than 50 percent to prevent damage at the dielectric layer 106.

Figure 5:
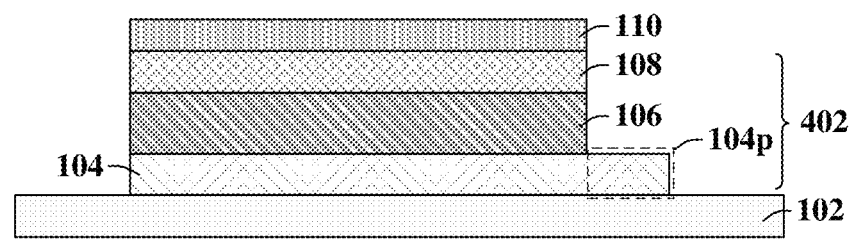

As shown in the cross-sectional view 500 of FIG. 5, a patterning step is performed to remove portions of the titanium getter layer 110, the top electrode 108, and the dielectric layer 106. The patterning step exposes a peripheral portion 104p of the bottom electrode 104. In some embodiments, the patterning step may be conducted according to a masking layer (not shown) formed over the titanium getter layer 110. In some embodiments, the masking layer may comprise a photosensitive material (e.g., photoresist) formed by a spin coating process. In such embodiments, the layer of photosensitive material is selectively exposed to electromagnetic radiation according to a photomask. The electromagnetic radiation modifies a solubility of exposed regions within the photosensitive material to define soluble regions. The photosensitive material is subsequently developed to define the masking layer by removing the soluble regions. An etching process (e.g., wet etch, dry etch) may then remove portions of the titanium getter layer 110, the top electrode 108, and the dielectric layer 106 according to the masking layer. In some embodiments, the etching process utilizes a single etchant to remove the titanium getter layer 110, the top electrode 108, and the dielectric layer 106 in one single step. In other embodiments, the etching process may include multiple steps with different etchants. Following the etching process, the masking layer may be stripped.

In some embodiments, the aforementioned patterning step comprising a photoresist and etching may leave behind residual hydrogen ions within the MIM stack 402. However, the hydrogen ions may accumulate in the titanium getter layer 110, which has a higher affinity for hydrogen than the layers in the MIM stack 402. Therefore, the titanium getter layer 110 prevents hydrogen accumulation in the MIM stack 402 and as a result, protects the MIM stack 402 from interface delamination, arcing, and eventually, device breakdown.

Figure 6:
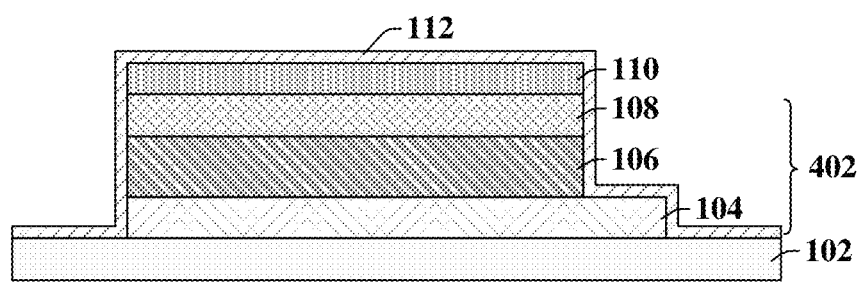

As shown in the cross-sectional view 600 of FIG. 6, in some embodiments, a passivation layer 112 may be deposited over the substrate 102 and the titanium getter layer 110. In some embodiments, the passivation layer 112 may be deposited by a deposition process (e.g., chemical vapor deposition (CVD), physical vapor deposition (PVD), atomic layer deposition (ALD), sputtering, etc.). The passivation layer 112 may comprise, for example, silicon oxide, silicon nitride, a metal oxide (e.g., aluminum oxide), or the like to protect the MIM stack 402 and the titanium getter layer 110 from environmental conditions. In some embodiments, the passivation layer 112 may have a thickness in a range of between approximately 10 angstroms and approximately 100 angstroms. In other embodiments, the passivation layer 112 may have a thickness in a range of between approximately 100 angstroms and approximately 0.1 micrometers. In other embodiments, the passivation layer 112 may have a thickness in a range of between approximately 0.1 micrometers and approximately 1 micrometer. In other embodiments, the passivation layer 112 may have a thickness in a range of between approximately 1 micrometer and approximately 100 micrometers. In other embodiments, the passivation layer 112 may have a thickness in a range of between approximately 100 micrometers and approximately 1 millimeter.

Figure 7:
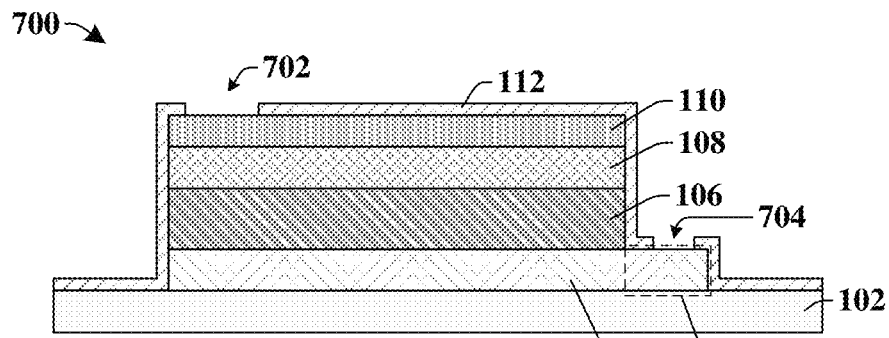

As shown in the cross-sectional view 700 of FIG. 7, the passivation layer 112 may be patterned to define a first opening 702 and a second opening 704 in the passivation layer 112. The first opening 702 exposes the titanium getter layer 110, and the second opening 704 exposes the peripheral portion 104p of the bottom electrode 104. In some embodiments, the patterning of the passivation layer 112 may be conducted using photolithography and etching. In some embodiments, the first opening 702 and the second opening 704 each have a width in a range of between approximately 10 micrometers and approximately 50 micrometers. In other embodiments, the first opening 702 and the second opening 704 each have a width in a range of between approximately 50 micrometers and approximately 100 micrometers. In other embodiments, the first opening 702 and the second opening 704 each have a width in a range of between approximately 100 micrometers and approximately 500 micrometers. In other embodiments, the first opening 702 and the second opening 704 each have a width in a range of between approximately 500 micrometers and approximately 10 millimeters. In other embodiments, the first opening 702 and the second opening 704 each have a width in a range of between approximately 10 millimeters and approximately 100 millimeters.

Figure 8:
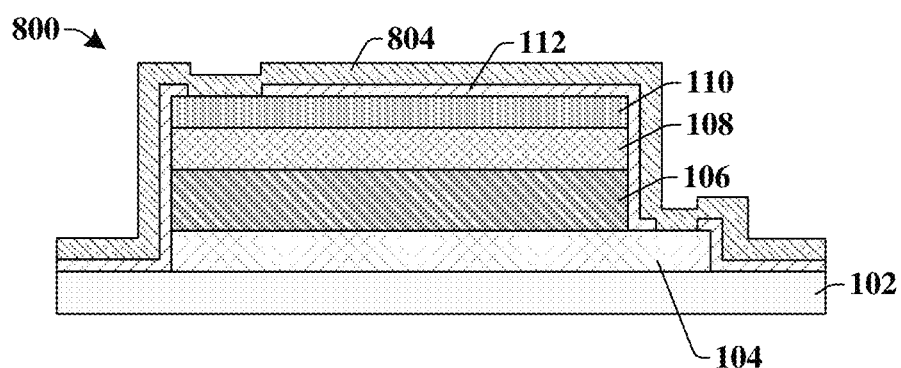

As shown in the cross-sectional view 800 of FIG. 8, in some embodiments, a metal layer 804 is deposited over the passivation layer 112. The metal layer 804 may contact the titanium getter layer 110 through the first opening (702 of FIG. 7) and the bottom electrode 104 through the second opening (704 of FIG. 7). In some embodiments, the metal layer 804 may be deposited by a deposition process (e.g., chemical vapor deposition (CVD), physical vapor deposition (PVD), atomic layer deposition (ALD), sputtering, etc.) to a thickness. The metal layer 804 comprises a conductive material such as copper, aluminum, or tungsten, for example. In some embodiments, the thickness of the metal layer 804 may be in a range of between approximately 10 angstroms and approximately 100 angstroms. In other embodiments, the thickness of the metal layer 804 may be in a range of between approximately 100 angstroms and approximately 0.1 micrometers. In other embodiments, the thickness of the metal layer 804 may be in a range of between approximately 0.1 micrometers and approximately 1 micrometer. In other embodiments, the thickness of the metal layer 804 may be in a range of between approximately 1 micrometer and approximately 100 micrometers. In other embodiments, the thickness of the metal layer 804 may be in a range of between approximately 100 micrometers and approximately 1 millimeter.

Figure 9:
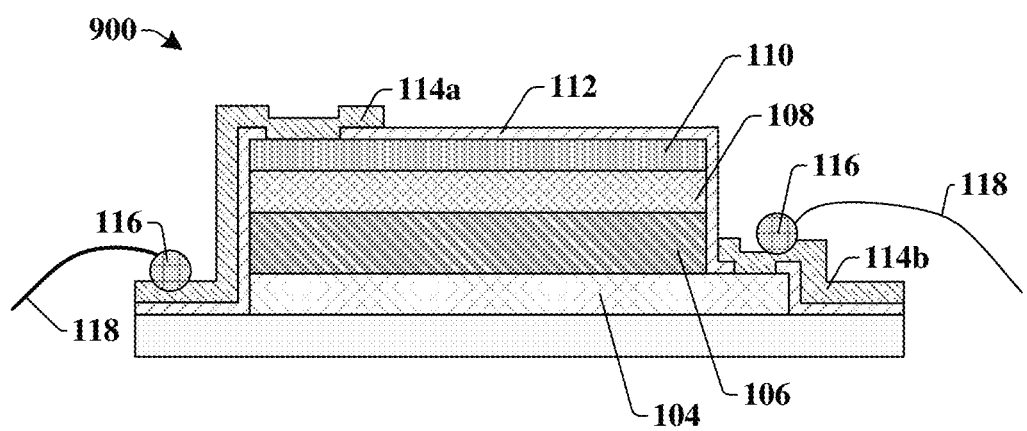

As shown in the cross-sectional view 900 of FIG. 9, the metal layer (804 of FIG. 8) is patterned to remove a portion of the metal layer (804 of FIG. 8) that is between the first opening (702 of FIG. 7) and the second opening (704 of FIG. 7). A remaining part of the metal layer (804 of FIG. 8) defines a first metal contact 114a electrically coupled to the top electrode 108 and a second metal contact 114b electrically coupled to the bottom electrode 104. In some embodiments, the first and second metal contacts 114a, 114b may then be coupled to wires 118 via solder bumps 116.

Figure 10:
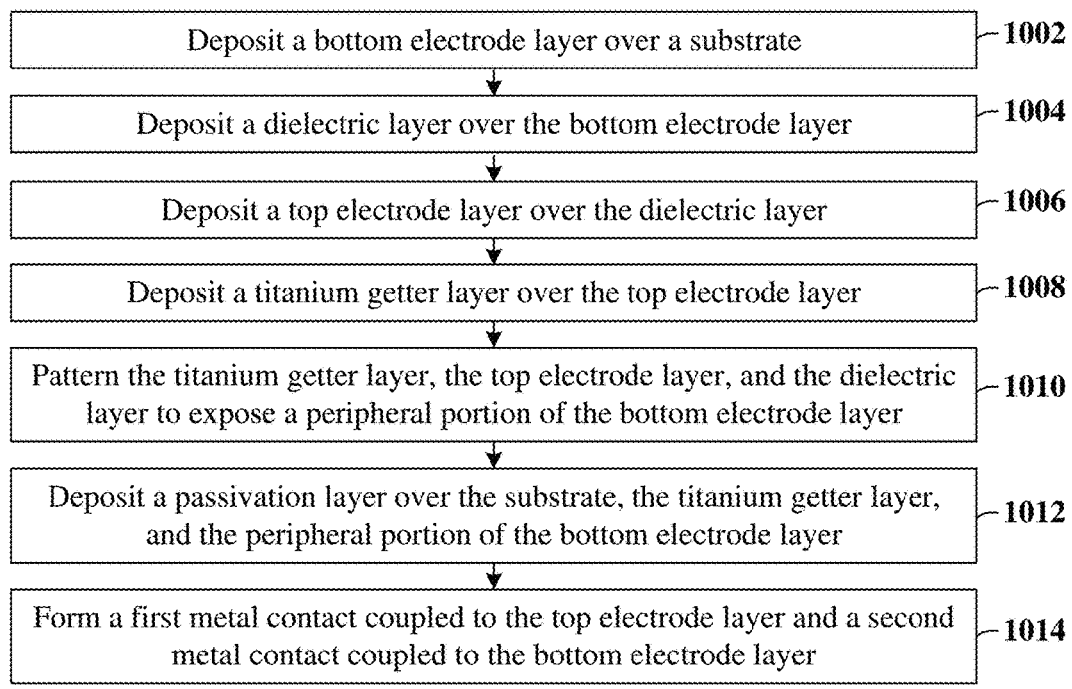
FIG. 10 illustrates a flow diagram of some embodiments of a method as illustrated in FIGS. 4-9.

FIG. 10 illustrates a flow diagram of some embodiments of a method 1000 of forming a MIM device having a titanium getter layer over the top electrode, as shown in FIGS. 4-9.

While the disclosed methods (e.g., methods 1000 and 1700) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1002, a bottom electrode layer is deposited over a substrate.

At act 1004, a dielectric layer is deposited over the bottom electrode layer.

At act 1006, a top electrode layer is deposited over the dielectric layer.

At act 1008, a titanium getter layer is deposited over the top electrode layer. FIG. 4 illustrates a cross-sectional view 400 of some embodiments corresponding to the acts 1002, 1004, 1006, and 1008.

At act 1010 the titanium getter layer, the top electrode layer, and the dielectric layer are patterned to expose a peripheral portion of the bottom electrode layer. FIG. 5 illustrates a cross-sectional view 500 of some embodiments corresponding to the act 1010.

At act 1012, a passivation layer is deposited over the substrate, the titanium getter layer, and the peripheral portion of the bottom electrode layer. FIG. 6 illustrates a cross-sectional view 600 of some embodiments corresponding to the act 1012.

At act 1014, a first metal contact and a second metal contact are formed. The first metal contact is coupled to the top electrode layer, and the second metal contact is coupled to the bottom electrode layer. FIGS. 7 and 8 illustrate cross-sectional views 700 and 800 of some embodiments corresponding to act 1014.

FIGS. 11-16 illustrate cross-sectional views 1100-1500 of some embodiments of a method of forming the MIM device of FIG. 2A having a titanium getter layer below a bottom electrode. Although FIGS. 11-16 are described in relation to a method, it will be appreciated that the structures disclosed in FIGS. 11-16 are not limited to such a method, but instead may stand alone as structures independent of the method.

Figure 11:
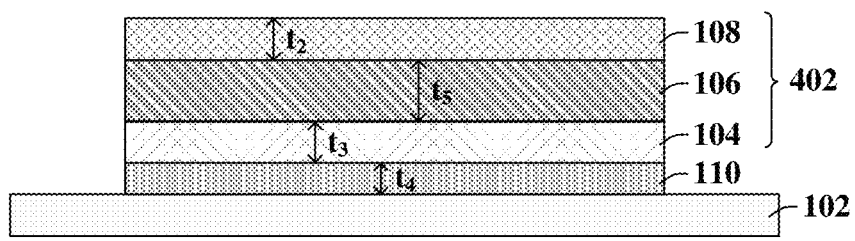
FIGS. 11-16 illustrate cross-sectional views of some embodiments of forming an MIM device comprising a titanium getter layer arranged below a bottom electrode.

As shown in the cross-sectional view 1100 of FIG. 11, a substrate 102 is provided. A titanium getter layer 110 is deposited on the substrate 102, and a MIM stack 402 is deposited over the titanium getter layer 110. The MIM stack 402 comprises a dielectric layer 106 deposited over a bottom electrode 104, and a top electrode 108 deposited over the dielectric layer 106. In some embodiments, the MIM stack 402 and the titanium getter layer 110 may be each deposited by a deposition process (e.g., chemical vapor deposition (CVD), physical vapor deposition (PVD), atomic layer deposition (ALD), sputtering, etc.).

In some embodiments, the titanium getter layer 110 has a second affinity for hydrogen that is greater than that of the dielectric layer 106 and the bottom electrode 104. Further, in some embodiments, the titanium getter layer 110 consists of titanium. In other embodiments, the titanium getter layer 110 comprises titanium and oxygen, wherein an atomic ratio of oxygen to titanium in the titanium getter layer 110 is less than 50 percent such that the second affinity is not compromised. Further, in some embodiments, a first ratio of a fourth thickness $t_4$ of the titanium getter layer 110 to a third thickness $t_3$ of the bottom electrode 104 is greater than 20 percent such that the second affinity is not compromised. In some embodiments, the bottom electrode 104 and/or the top electrode 108 also comprise titanium to aid in the accumulation of hydrogen ions. In such embodiments, the second affinity for hydrogen may be substantially equal to the affinities of the bottom electrode 104 and/or the top electrode 108. Nevertheless, in such embodiments, hydrogen ions are still drawn to the top electrode 108, the bottom electrode, and/or the titanium getter layer 110, which is away from the dielectric layer 106.

The top electrode 104 has a second thickness $t_2$ and the dielectric layer 106 has a fifth thickness $t_5$. In some embodiments, the second thickness $t_2$, the third thickness $t_3$, the fourth thickness $t_4$, and the fifth thickness $t_5$ may each be in a range of between approximately 10 angstroms and approximately 100 angstroms. In other embodiments, the second thickness $t_2$, the third thickness $t_3$, the fourth thickness $t_4$, and the fifth thickness $t_5$ may each be in a range of between approximately 100 angstroms and approximately 0.1 micrometers. In other embodiments, the second thickness $t_2$, the third thickness $t_3$, the fourth thickness $t_4$, and the fifth thickness $t_5$ may each be in a range of between approximately 0.1 micrometers and approximately 1 micrometer. In other embodiments, the second thickness $t_2$, the third thickness $t_3$, the fourth thickness $t_4$, and the fifth thickness $t_5$ may each be in a range of between approximately 1 micrometer and approximately 100 micrometers. In other embodiments, the second thickness $t_2$, the third thickness $t_3$, the fourth thickness $t_4$, and the fifth thickness $t_5$ may each be in a range of between approximately 100 micrometers and approximately 1 millimeter. Nevertheless, the first ratio is greater than 50 percent to prevent damage at the dielectric layer 106.

Figure 12:
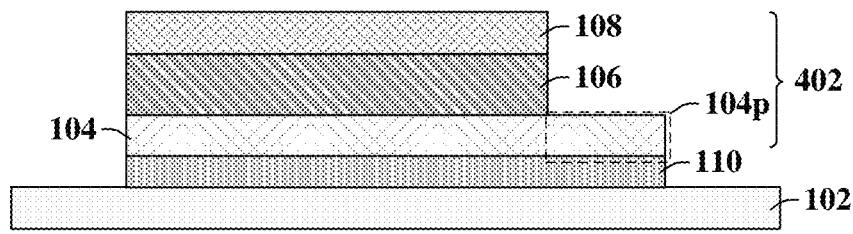

As shown in the cross-sectional view 1200 of FIG. 12, a patterning step is performed to remove portions of the top electrode 108 and the dielectric layer 106 to expose a peripheral portion 104p of the bottom electrode 104. In some embodiments, the patterning step utilizes a photoresist to form a masking layer as described in the patterning step of FIG. 5. Then, an etching process (e.g., wet etch, dry etch) may then remove portions of the top electrode 108 and the dielectric layer 106 according to the masking layer. In some embodiments, the etching process utilizes a single etchant to remove the top electrode 108 and the dielectric layer 106 in one single step. In other embodiments, the etching process may include multiple steps with different etchants. Following the etching process, the masking layer may be stripped.

In some embodiments, the aforementioned patterning step comprising a photoresist and etching may leave behind residual hydrogen ions within the MIM stack 402. However, the hydrogen ions may accumulate in the titanium getter layer 110, which has a higher affinity for hydrogen than the layers in the MIM stack 402. Therefore, the titanium getter layer 110 prevents hydrogen accumulation in the MIM stack 402, and as a result, protects the MIM stack 402 from interface delamination, arcing, and eventually, device breakdown.

Figure 13:
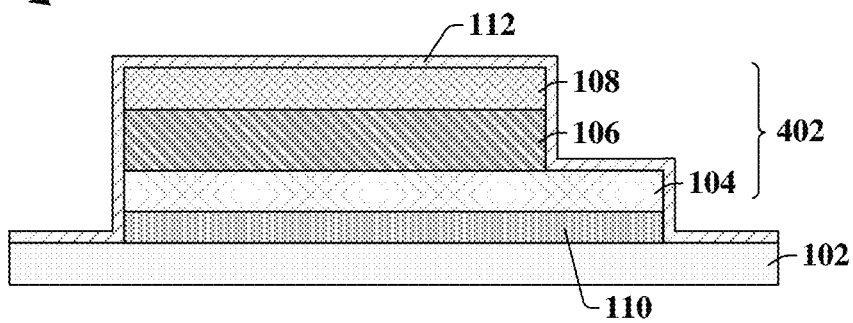

As shown in the cross-sectional view 1300 of FIG. 13, in some embodiments, a passivation layer 112 may be deposited over the substrate 102 and the MIM stack 402.

Figure 14:
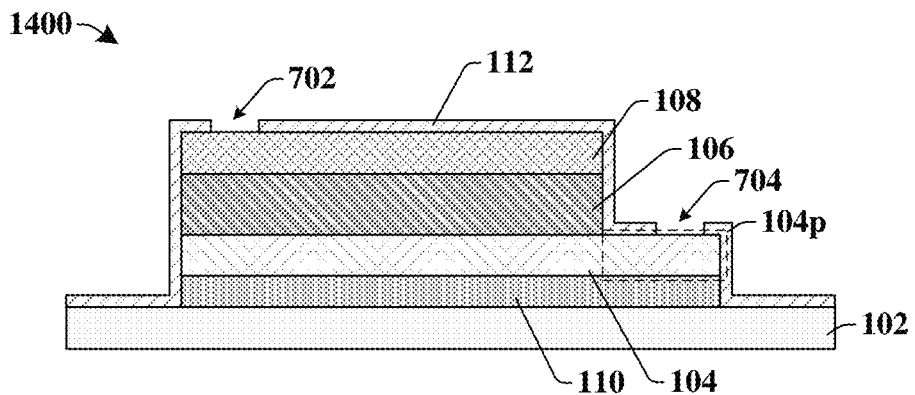

As shown in the cross-sectional view 1400 of FIG. 14, passivation layer 112 may be patterned to define a first opening 702 and a second opening 704 in the passivation layer 112. The first opening 702 exposes the top electrode 108, and the second opening 704 exposes the peripheral portion 104p of the bottom electrode 104. In some embodiments, the patterning of the passivation layer 112 may be conducted using photolithography and etching.

Figure 15:
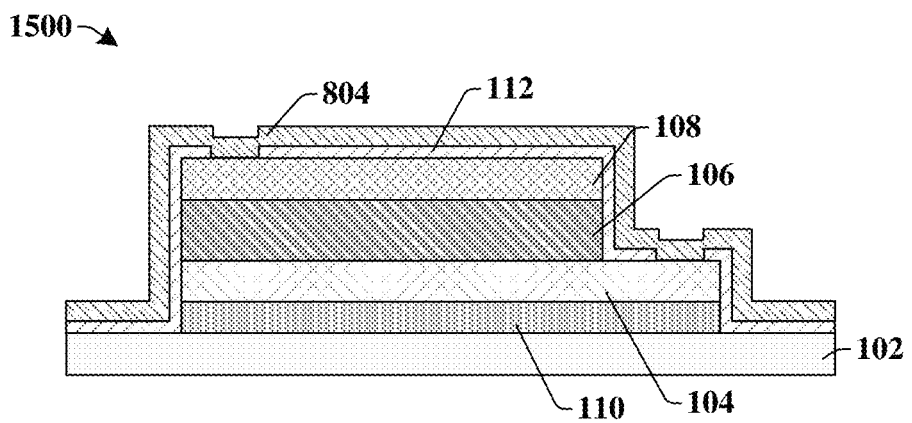

As shown in the cross-sectional view 1500 of FIG. 15, in some embodiments, a metal layer 804 is deposited over the passivation layer 112. The metal layer 804 may contact the top electrode 108 through the first opening (702 of FIG. 14), and the metal layer 804 may contact the bottom electrode 104 through the second opening (704 of FIG. 14). In some embodiments, the metal layer 804 may be deposited by a deposition process (e.g., chemical vapor deposition (CVD), physical vapor deposition (PVD), atomic layer deposition (ALD), sputtering, etc.). The metal layer 804 comprises a conductive material such as copper, aluminum, or tungsten, for example.

Figure 16:
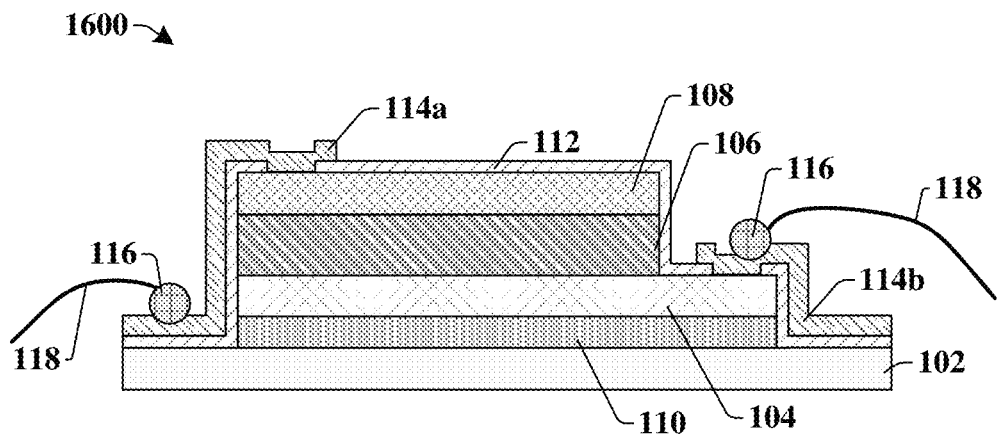

A shown in the cross-sectional view 1600 of FIG. 16, the metal layer (804 of FIG. 15) is patterned to remove a portion of the metal layer (804 of FIG. 16) that is between the first opening (702 of FIG. 14) and the second opening (704 of FIG. 14), such that the remaining metal layer (804 of FIG. 15) defines a first metal contact 114a electrically coupled to the top electrode 108 and a second metal contact 114b electrically coupled to the bottom electrode 104. In some embodiments, the first and second metal contacts 114a, 114b may then be coupled to wires 118 via solder bumps 116.

Figure 17:
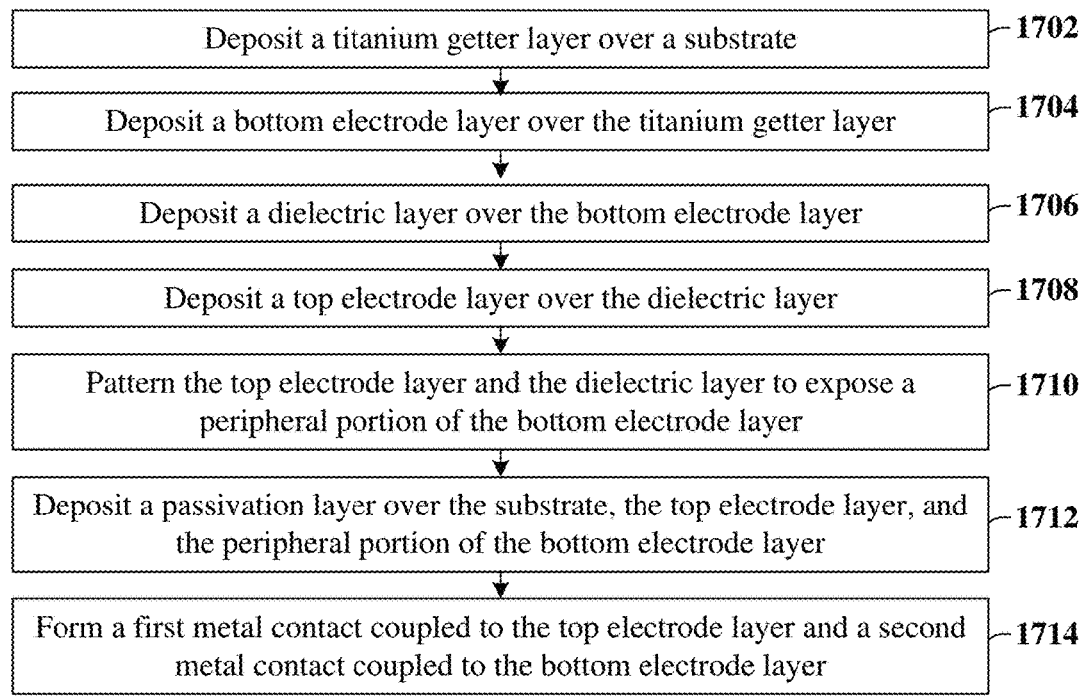
FIG. 17 illustrates a flow diagram of some embodiments of a method as illustrated in FIGS. 11-16.

FIG. 17 illustrates a flow diagram of some embodiments of a method 1700 of forming a MIM device having a titanium getter layer over the top electrode, as shown in FIGS. 11-16.

At act 1702, a titanium getter layer is deposited over a substrate.

At act 1704, a bottom electrode layer is deposited over the titanium getter layer.

At act 1706, a dielectric layer is deposited over the bottom electrode layer.

At act 1708, a top electrode layer is deposited over the dielectric layer. FIG. 11 illustrates a cross-sectional view 1100 of some embodiments corresponding to the acts 1702, 1704, 1706, and 1708.

At act 1710 the top electrode layer and the dielectric layer are patterned to expose a peripheral portion of the bottom electrode layer. FIG. 12 illustrates a cross-sectional view 1200 of some embodiments corresponding to the act 1710.

At act 1712, a passivation layer is deposited over the substrate, the top electrode layer, and the peripheral portion of the bottom electrode layer. FIG. 13 illustrates a cross-sectional view 1300 of some embodiments corresponding to the act 1712.

At act 1714, a first metal contact and a second metal contact are formed. The first metal contact is coupled to the top electrode layer, and the second metal contact is coupled to the bottom electrode layer. FIGS. 14 and 15 illustrate cross-sectional views 1400 and 1500 of some embodiments corresponding to act 1714.

Further, it will be appreciated that the method illustrated in FIGS. 4-9 of forming a MIM device with a titanium getter layer arranged above a top electrode and that the method illustrated in FIGS. 11-16 of forming a MIM device with a titanium getter layer arranged below a top electrode may be combined to form the embodiment illustrated in FIG. 3A, where a first titanium getter layer is arranged above a top electrode and a second titanium getter layer is arranged below a bottom electrode. For example, by depositing an additional titanium getter layer over the substrate 102 in FIG. 4 before depositing the MIM stack 402, followed by the rest of the steps illustrated in FIGS. 4-9, the MIM device in FIG. 3A would be formed.

Therefore, the present disclosure relates to a method for forming a MIM device having a titanium getter layer arranged below a bottom electrode, above a top electrode, or both below a bottom electrode and above a top electrode, in order to prevent hydrogen ions from accumulating in and subsequently damaging the dielectric layer.

Accordingly, in some embodiments, the present disclosure relates to a metal-insulator-metal (MIM) device, comprising: a substrate; a first electrode and a second electrode stacked over the substrate; a dielectric layer arranged between the first and second electrodes; and a titanium getter layer disposed over the substrate and separated from the dielectric layer by the first electrode, wherein the titanium getter layer has a higher getter capacity for hydrogen than the dielectric layer.

In other embodiments, the present disclosure relates to a metal-insulator-metal (MIM) device, comprising: a MIM stack disposed over a substrate, the MIM stack comprising a dielectric layer between a first electrode layer and a second electrode layer; a titanium getter layer contacting the first electrode layer and separated from the dielectric layer by the first electrode layer; wherein the titanium getter layer has a higher getter capacity for hydrogen than the dielectric layer; and wherein the titanium getter layer has a thickness that is at least 20 percent of a thickness of the first electrode layer.

In yet other embodiments, the present disclosure relates to a method of forming a metal-insulator-metal (MIM) device, comprising: depositing a bottom electrode layer over a substrate; depositing a dielectric layer over the bottom electrode layer; depositing a top electrode layer over the dielectric layer; depositing a first titanium getter layer over the top electrode layer; patterning the first titanium getter layer, the top electrode layer, and the dielectric layer to expose a peripheral portion of the bottom electrode layer; and depositing a passivation layer over the substrate, the first titanium getter layer, and the peripheral portion of the bottom electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a metal-insulator-metal (MIM) device, comprising:
   depositing a bottom electrode layer over a substrate;
   depositing a dielectric layer over the bottom electrode layer;
   depositing a top electrode layer over the dielectric layer;
   depositing a first titanium getter layer over the top electrode layer;
   patterning the first titanium getter layer, the top electrode layer, and the dielectric layer to expose a peripheral portion of the bottom electrode layer;
   depositing a passivation layer over the substrate, the first titanium getter layer, and the peripheral portion of the bottom electrode layer; and
   forming a first solder bump onto an upper surface of a conductive layer disposed over the passivation layer and electrically connected to the top electrode layer, wherein the first solder bump is below a bottommost surface of the top electrode layer.

2. The method of claim 1, wherein a middle portion of the MIM device has a first non-zero concentration of hydrogen and a top portion of the MIM device has a second non-zero concentration of hydrogen that is greater than the first non-zero concentration and a third non-zero concentration of hydrogen that is less than the first non-zero concentration, the middle portion including the dielectric layer and the top portion including the top electrode layer and the first titanium getter layer.

3. The method of claim 2, further comprising:
   forming a second conductive layer onto the bottom electrode layer, wherein a bottommost surface of the second conductive layer is directly over an upper surface of the passivation layer.

4. The method of claim 3, wherein the passivation layer has a sidewall that is entirely laterally outside of the bottom electrode layer, the sidewall being laterally disposed between the bottom electrode layer and the second conductive layer and being vertically disposed between first and second upper surfaces of the passivation layer that face away from the substrate.

5. The method of claim 4, wherein the sidewall of the passivation layer vertically extends from over a top of the bottom electrode layer to below the top of the bottom electrode layer.

6. The method of claim 4, wherein the dielectric layer has a first getter capacity for hydrogen, the top electrode layer has a second getter capacity for hydrogen, and the first titanium getter layer has a third getter capacity for hydrogen, the third getter capacity for hydrogen being equal to the second getter capacity for hydrogen and greater than the first getter capacity for hydrogen.

7. The method of claim 1, wherein the passivation layer has a maximum thickness that is less than a maximum thickness of the bottom electrode layer.

8. A method of forming a metal-insulator-metal (MIM) device, comprising:
   depositing a bottom electrode layer over a substrate;
   depositing a dielectric layer over the bottom electrode layer;
   depositing a top electrode layer over the dielectric layer;
   depositing a first getter layer over the top electrode layer;
   patterning the first getter layer, the top electrode layer, and the dielectric layer; and
   forming a first conductive layer onto the bottom electrode layer, wherein the first conductive layer has a sidewall that faces away from the bottom electrode layer, an entirety of the sidewall being laterally outside of the bottom electrode layer and vertically disposed between first and second upper surfaces of the first conductive layer that face away from the substrate.

9. The method of claim 8, wherein after depositing the first getter layer, outer sidewalls of the first getter layer are aligned with outer sidewalls of the bottom electrode layer, wherein the patterning of the first getter layer occurs after the deposition of the first getter layer, and wherein the patterning of the first getter layer exposes a region of the bottom electrode layer that extends laterally past the first getter layer.

10. The method of claim 8, further comprising:
    forming a second conductive layer to contact the top electrode layer; and
    wherein the first conductive layer and the second conductive layer are both laterally separated from the dielectric layer.

11. The method of claim 10, further comprising:
    forming a passivation layer along sidewalls of the bottom electrode layer, wherein the passivation layer laterally separates the sidewall of the first conductive layer from the bottom electrode layer.

12. A method of forming a metal-insulator-metal (MIM) device, comprising:
    forming a first electrode layer, a second electrode layer, a dielectric layer, and a first titanium getter layer over a substrate, wherein the second electrode layer is over the first electrode layer, the dielectric layer is between the first electrode layer and the second electrode layer, and the first titanium getter layer is separated from the dielectric layer by the first electrode layer;
    patterning the first titanium getter layer, the first electrode layer, the dielectric layer, or the second electrode layer;
    forming a passivation layer along sidewalls and over upper surfaces of the first electrode layer, the dielectric layer, and the second electrode layer; and
    forming a first conductive pad to extend through the passivation layer and contact the first electrode layer, the first conductive pad having a bottommost surface that is disposed directly over an upper surface of the passivation layer.

13. The method of claim 12, further comprising:
    forming a second titanium getter layer, wherein the first titanium getter layer is separated from the second titanium getter layer by the first electrode layer, the second electrode layer, and the dielectric layer.

14. The method of claim 12, further comprising:
    depositing the first titanium getter layer to have a non-zero atomic ratio of oxygen to titanium that is less than 50 percent.

15. The method of claim 12, further comprising:
    forming a second conductive pad to extend through the passivation layer and electrically contact the second electrode layer.

16. The method of claim 15,
    wherein the passivation layer has a horizontally extending surface protruding outward from a sidewall of the passivation layer, the horizontally extending surface being directly over the first electrode layer and laterally and directly between the sidewall of the dielectric layer and a sidewall of the first conductive pad.

17. The method of claim 15, further comprising:
    forming a bonding structure onto the first conductive pad.

18. The method of claim 12, wherein the first titanium getter layer has a first thickness and the first electrode layer has a second thickness, a first ratio of the first thickness to the second thickness being greater than 20 percent.

19. The method of claim 12,
    wherein the first conductive pad continuously extends through the passivation layer and to below a top surface of the first electrode layer.

20. The method of claim 12, further comprising:
    forming a second conductive pad on the second electrode layer, wherein the first conductive pad covers a first side of the first electrode layer and the second conductive pad covers a second side of the first electrode layer, the first side opposing the second side.

* * * * *